(12) United States Patent
Zheng et al.

(10) Patent No.: US 9,949,012 B2
(45) Date of Patent: Apr. 17, 2018

(54) LINE CONTROL DEVICE OF EARPHONE

(71) Applicant: GOERTEK INC., WeiFang (CN)

(72) Inventors: Wentuan Zheng, WeiFang (CN); Xiu Liu, WeiFang (CN); Jiangtao Xu, WeiFang (CN)

(73) Assignee: GOERTEK INC., Weifang (CN)

( * ) Notice: Subject to any disclaimer, the term of this patent is extended or adjusted under 35 U.S.C. 154(b) by 0 days.

(21) Appl. No.: 15/124,330

(22) PCT Filed: Mar. 5, 2015

(86) PCT No.: PCT/CN2015/073700
§ 371 (c)(1),
(2) Date: Sep. 7, 2016

(87) PCT Pub. No.: WO2015/131838
PCT Pub. Date: Sep. 11, 2015

(65) Prior Publication Data
US 2017/0064430 A1 Mar. 2, 2017

(30) Foreign Application Priority Data
Mar. 7, 2014 (CN) .......................... 2014 1 0081963

(51) Int. Cl.
*H04R 1/10* (2006.01)
*H01H 13/70* (2006.01)
(Continued)

(52) U.S. Cl.
CPC ........... *H04R 1/1041* (2013.01); *H01H 13/70* (2013.01); *H01H 13/86* (2013.01); *H05K 5/0017* (2013.01);
(Continued)

(58) Field of Classification Search
CPC .. H04R 1/1041; H01H 9/0214; H01H 9/0228; H01H 9/04; H01H 13/81;
(Continued)

(56) References Cited

U.S. PATENT DOCUMENTS 5,701,355 A * 12/1997 Brannan .................. H04R 1/08
174/653
6,007,377 A * 12/1999 Cook .................... H01H 9/0228
174/77 R
(Continued)

FOREIGN PATENT DOCUMENTS

CN 101115410 A 1/2008
CN 201508788 U 6/2010
(Continued)

OTHER PUBLICATIONS

Office Action from Chinese Patent Office for Application No. 201410081963.9, dated Feb. 6, 2017.
(Continued)

*Primary Examiner* — Joshua Kaufman

(57) ABSTRACT

A line control device of an earphone includes an upper cover; a middle cover being detachably and fixedly connected to the upper cover, wherein, an arranging space for arranging a control panel is enclosed between the upper cover and the middle cover; and a lower cover being fixedly connected to the middle cover, wherein, shielding parts are formed on the edges at both sides of the middle cover, and the shielding parts are used for sealing the gaps between the upper cover and the lower cover.

8 Claims, 3 Drawing Sheets

(51) Int. Cl.
*H05K 5/00* (2006.01)
*H05K 5/06* (2006.01)
*H01H 13/86* (2006.01)

(52) U.S. Cl.
CPC ....... *H05K 5/069* (2013.01); *H01H 2223/002* (2013.01); *H01H 2231/00* (2013.01)

(58) Field of Classification Search
CPC ............. H01H 13/86; H01H 2003/007; H01H 2203/056; H05K 5/0013; H05K 5/0017; H05K 5/069
See application file for complete search history.

(56) References Cited

U.S. PATENT DOCUMENTS

| | | | | |
|---|---|---|---|---|
| 6,898,295 | B2* | 5/2005 | Inamura | H01B 7/00 |
| | | | | 381/374 |
| 8,853,581 | B2* | 10/2014 | Prest | H01H 13/7057 |
| | | | | 200/406 |
| 8,885,355 | B2* | 11/2014 | Stanley | H05K 5/0013 |
| | | | | 200/237 |
| 9,704,663 | B2* | 7/2017 | Stanley | H01H 9/0228 |
| 2008/0166003 | A1* | 7/2008 | Hankey | H01H 9/0228 |
| | | | | 381/370 |
| 2010/0054493 | A1* | 3/2010 | Lin | H01H 9/0228 |
| | | | | 381/74 |
| 2014/0254848 | A1* | 9/2014 | Petterson | H04R 1/1041 |
| | | | | 381/334 |
| 2015/0110320 | A1* | 4/2015 | Liu | H04R 1/1016 |
| | | | | 381/322 |
| 2017/0064430 | A1* | 3/2017 | Zheng | H04R 1/1041 |

FOREIGN PATENT DOCUMENTS

| | | |
|---|---|---|
| CN | 102017653 A | 4/2011 |
| CN | 202918354 U | 5/2013 |
| CN | 203072128 U | 7/2013 |
| CN | 103888864 A | 6/2014 |
| CN | 203747964 U | 7/2014 |

OTHER PUBLICATIONS

International Search Report for International Patent Application No. PCT/CN2015/073700 filed on Mar. 5, 2015.
Office Action from Korean Patent Office for Application No. 10-2016-7025632 dated Sep. 29, 2017.

* cited by examiner

LINE CONTROL DEVICE OF EARPHONE

TECHNICAL FIELD

The present invention relates to a line control assembly for controlling an earphone, and particularly to a line control device of an earphone.

BACKGROUND ART

At present, most of line control assemblies (conboxes) of earphones for mobile phones are only provided with an answer function. One structure employs an upper cover and a lower cover which are directly connected through a snap fit/snap joint, and when the upper cover is pressed, a rib provided on the upper cover presses a button on a circuit board to achieve a function control. Another structure employs an upper cover and a lower cover which are connected by ultrasonic hot melting, and a movable button is mounted on the upper cover, when the button is pressed, a rib provided through the button presses a button on a circuit board to achieve a function control.

The first kind of structure mentioned above has disadvantages of larger gaps between the upper cover and lower cover, and easy to introduce dusts and sweats, which cause corrosion to the circuit board after long-term use and then influence the normal function, meanwhile, this structure only can be applied to line control assemblies with a single button. When the line control assembly is required to provide a plurality of function buttons, a plurality of buttons are communicated at the same time when pressed due to a restriction of this structure, which will cause problems such as functional disorder. As for the second kind of structure mentioned above, rack of fusion is easy to occur due to the use of the ultrasonic welding process, and all the parts will be completely scrapped when the rack of fusion occurs, which will cause problems such as higher costs and material waste.

As earlier designed earphones for mobile phones have simple structures and only require an answer function, and do not require multi-functions, such as, song volume control and pause, which results in a simple structure of line control assembly.

As increasingly powerful functions of mobile phones at present, more and more functions are required in earphones, which requires a line control assembly with a multi-button structure which has a simple structure and is convenient to detach and replace.

SUMMARY

In order to eliminate the above drawbacks in prior art, the present invention provides a line control device of an earphone to achieve multi-function control, convenient disassembly and replacement of parts or components, and to prevent the perspirations and dusts from being introduced into the line control device.

In order to achieve the above objectives, a line control device of an earphone is provided by the present invention, the line control device of an earphone comprises: an upper cover; a middle cover, wherein, the middle cover is detachably and fixedly connected to the upper cover, and an arrangement space for arranging a control board is formed between the upper cover and the middle cover; and a lower cover, wherein, the lower cover is fixedly connected to the middle cover, and a housing which surrounds the control board and the middle cover is formed by the lower cover and the upper cover opposite to each other, wherein, shielding parts are formed on edges at both sides of the middle cover, and the shielding parts are used for sealing gaps between the upper cover and the lower cover.

The line control device of an earphone further comprises sealing strips, and upper cover grooves and lower cover grooves for accommodating the sealing strips are provided at inner sides of opposite edges of the upper cover and the lower cover respectively, and the shielding parts abut against the sealing strips to seal the gaps between the upper cover and the lower cover.

The line control device of an earphone, wherein, the sealing strips are formed by integrally extending from peripheral edges of the shielding parts.

The line control device of an earphone, wherein, the upper cover and the middle cover are respectively provided with a hook part and a holding part capable of snap fitting with each other.

The line control device of an earphone, wherein, the control board is provided in accommodating grooves at inner edges of the shielding parts of the middle cover, and is limited by a stopper extending from an interior portion of the middle cover to the control board.

The line control device of an earphone, wherein, the control board is provided with a dodging groove for the hook part to pass through.

The line control device of an earphone, wherein, at least two function buttons facing the upper cover are provided on the control board; operation parts, which are opposite to the function buttons and are used for pressing and operating the function buttons, are provided on the upper cover, and the operation parts comprise a convex operation part and a concave operation part which are alternately and adjacently provided; a limiting part extending from an inner side of the upper cover to the control board is provided on the upper cover, and the limiting part is provided on a connection part between the convex operation part and the concave operation part, or provided on the convex operation part at a position adjacent to the connection part, wherein, the limiting part is used to limit a range for pressing the connection part down.

The line control device of an earphone, wherein, the limiting part is a limiting post, one end of the limiting post is connected to the inner side of the upper cover, and another end of the limiting post is spaced apart from the control board, or abuts on the control board.

The line control device of an earphone, wherein, threading parts for wires to pass through are provided at both ends of the middle cover, sealing sleeves are sleeved on the wires, and the sealing sleeves are located between the wires and the threading parts.

The line control device of an earphone, wherein, the sealing sleeves and the threading parts of the middle cover are integrally formed.

As described above, the line control device of an earphone of the present invention can achieve multi-function control by using the above structure, meanwhile, it is convenient to disassemble and replace damaged parts and components due to the simple elastically snap-fitting manner, so that the costs are low, besides, by utilizing the shielding parts of the middle cover, perspirations and dusts can be prevented from entering inside the line control assembly, so that it is avoided that the function is influenced because the control board is corroded.

BRIEF DESCRIPTION OF THE DRAWINGS

By referring to the descriptions in connection with the accompanying drawings and the contents of the claims, other purposes and results of the present invention will be more clearly and easily understand. In the drawings:

DETAILED DESCRIPTION OF EMBODIMENTS

The embodiments of the line control device of an earphone according to the present invention will be described below in connection with the accompanying drawings. Various manners can be utilized to modify the described embodiments without departing from the spirit and scope of the present invention, as can be realized by those skilled in the art. Consequently, the accompanying drawings and the description are illustrative in essence, and not intended to limit the scope of protection. In addition, in the present description, the same reference numbers refer to the same or like parts.

Figure 1:
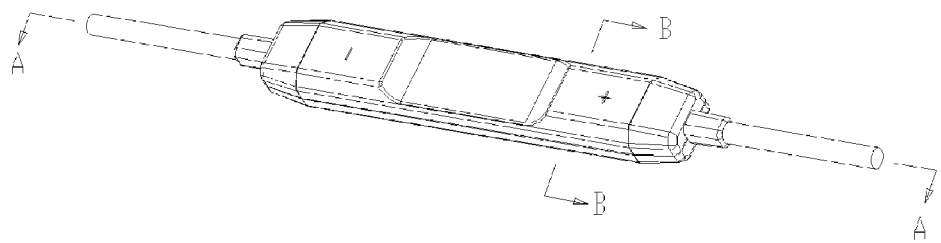
FIG. 1 is a three-dimensional structure view of the first embodiment of the line control device of an earphone according to the present invention.
Figure 2:
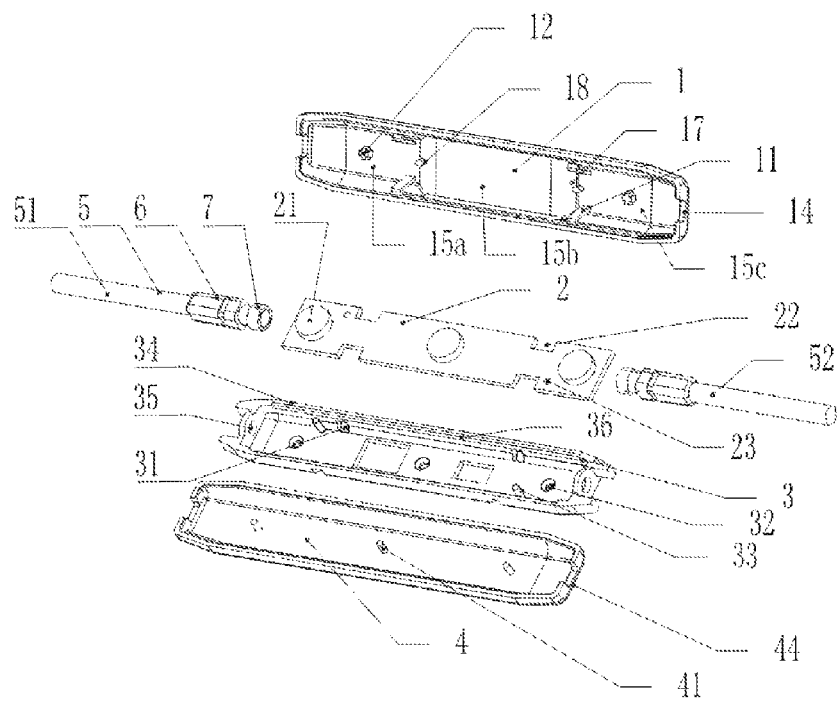
FIG. 2 is an exploded view of the first embodiment of the line control device of an earphone according to the present invention.
Figure 3:
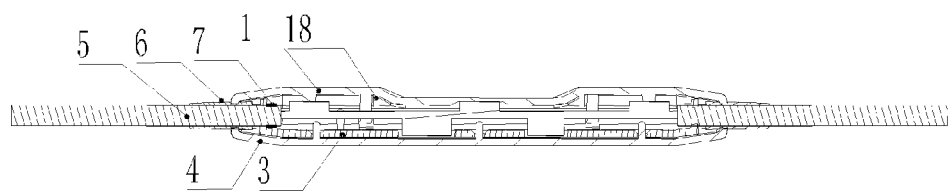
FIG. 3 is a cross sectional view of the first embodiment of the line control device of an earphone according to the present invention taken along line A-A in FIG. 1.

FIG. 1 to FIG. 3 are schematic views of the line control device of an earphone according to the present invention. The line control device of an earphone according to the present invention may be applied to audio playback devices such as cellphones, MP3 players, computers and the like, and the line control device comprises a housing formed by an upper cover 1 and a lower cover 4 which are opposite to each other, a control board 2 and a middle cover 3 are provided in the housing, and the wires 5 of the earphone comprise an audio input wire 51 and an audio output wire 52, which penetrate into the housing through openings at both ends of the housing respectively, and are electrically connected to the control board 2. The opening of each of the ends of the above housing is formed by combining an upper cover recess 14 and a lower cover recess 44.

Figure 4:
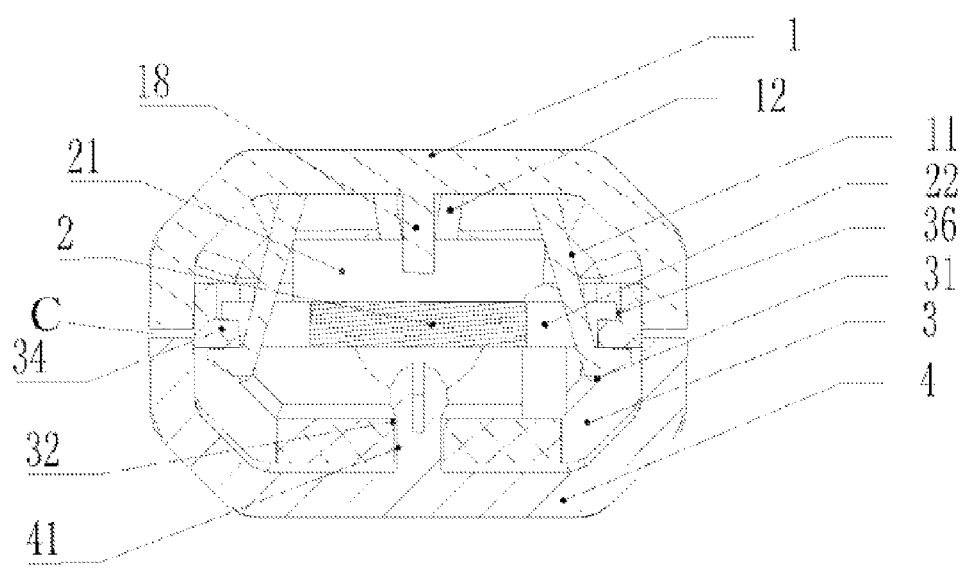
FIG. 4 is a cross sectional view of the first embodiment of the line control device of an earphone according to the present invention taken along line B-B in FIG. 1.

FIG. 2 to FIG. 4 show the first embodiment of the present invention, wherein, the upper cover 1 and the middle cover 3 are fixedly and detachably connected, and an arrangement space for arranging the control board 2 is formed between the upper cover 1 and the middle cover 3. As shown in FIG. 2 and FIG. 4, two lateral edges, which are extending along the longitudinal direction of the middle cover, of the middle cover 3 respectively extend upward from the bottom of the middle cover to form wall-shaped shielding parts 34 with a certain height, the upper portions of the inner edges of the two shielding parts 34 are provided with strip-shaped accommodating grooves 36 respectively, two edges of the control board 2 are accommodated in two accommodating grooves 36 respectively, so that the control board 2 is supported and limited by the accommodating grooves 36; two columnar stoppers 33 extending from the inner side of the bottom of the middle cover 3 to the control board 2 are provided on the middle cover, and the control board 2 is limited by two stoppers 33 penetrating through limiting holes 23 provided on the control board 2 respectively. Of course, the control board 2 may be limited through being abutted or clamped by the stoppers 33 and other components (such as the upper cover or the middle cover). Thus, the limiting holes 23 are not necessarily provided on the control board 2. Additionally, as shown in FIG. 2, threading parts 35 for the audio input wire 51 and the audio output wire 52 of the earphone to pass through are provided at both ends of the middle cover 3, and the threading parts 35 are located between two shielding parts 34.

As shown in FIG. 2 and FIG. 4, in the first embodiment above, holding parts 31 are provided at the bottoms of the two shielding parts 34 of the middle cover 3, so that two pairs of hook parts 11, which are obliquely extending from the inner side of the upper cover 1 to the middle cover 3 and are elastically moveable, may be connected to the holding parts in a snap-fitting manner, so as to connect the upper cover 1 and the middle cover 3 in a snap-fitting manner, and to form the arrangement space between the upper cover 1 and the middle cover 3, dodging grooves 22 for the hook parts 11 to pass through are provided on the control board 2, which is provided in the arrangement space, at the positions opposite to the hook parts 11, so as to dodge the hook parts 11, thereby elastically snap fitting the hook parts 11 onto the holding parts 31 of the middle cover 3. In the present embodiment, the holding parts 31 are two pairs of snap-fitting grooves provided at the bottoms of the two shielding parts 34 of the middle cover 3. The above snap-fitting manner may be embodied by snap fitting hook-shaped hook parts with holding parts such as snap-fitting grooves, snap-fitting rings, snap-fitting hooks and the like. In addition, the positions of the above hook parts 11 and the holding parts 31 may be interchanged, as long as the hook parts 11 and the holding parts 31 opposite to each other are respectively provided on the middle cover 3 and the upper cover 1. The contact surfaces of the hook parts 11 and the holding parts 31 may be designed with an arc or incline shape, so that the hook parts 11 are easy to be disengaged from the holding parts 31 when detaching the upper cover 1. As shown in FIG. 2 and FIG. 4, in the first embodiment above, three fixing holes 32 are provided at the bottom of the middle cover 3, and three fixing pieces 41 protruding from the inner side of the lower cover 4 towards the middle cover 3 are provided on the lower cover 4, so that the three fixing pieces 41 may pass through the three fixing holes 32 respectively, thereby fixing the lower cover 4 and the middle cover 3 together. As can be seen in the present embodiment, the upper cover 1 and the lower cover 4 are fixedly connected with the middle cover 3 respectively, the positions of the upper cover 1 and the lower cover 4 are relatively fixed through the middle cover 3, which enables the edges of the upper cover 1 and the lower cover 4 to be close to each other, thereby forming a housing, and narrow gaps C may be formed between the edges of the upper cover 1 and the lower cover 4 close to each other. Two shielding parts 34 with a certain height of the middle cover 3 are respectively used for enclosing the gaps C at two sides of the housing formed by the upper cover 1 and the lower cover 4, meanwhile, the above holding parts 31 are positioned at the bottom of the shielding parts 34 to avoid the gaps C, thereby enabling the shielding parts 34 to completely cover the gaps C.

Figure 7:
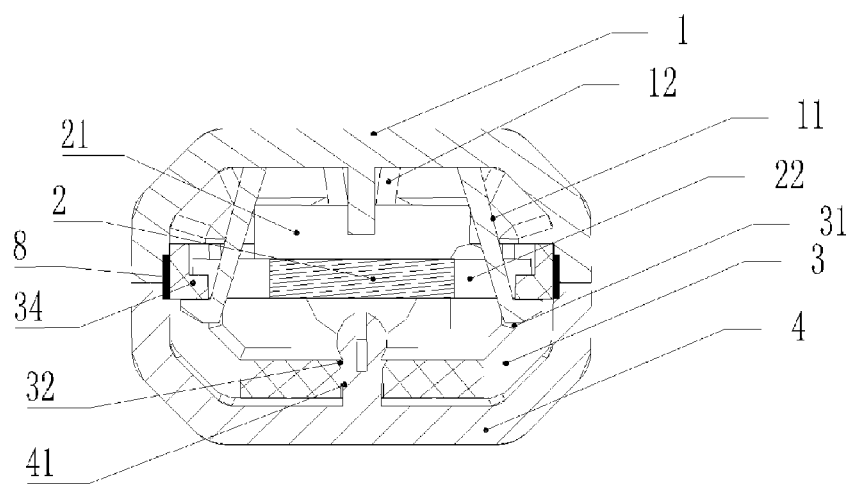
FIG. 7 is a cross sectional view of the second embodiment of the line control device of an earphone according to the present invention taken along line B-B in FIG. 1.

The combined structure of the first embodiment is explained below with respect to FIG. 2 to FIG. 4:

The above wires 5 penetrate into the middle cover 3 through the threading parts 35, the control board 2 is embedded into the two accommodating grooves 36 of the middle cover 3, and the audio input wire 51 and the audio output wire 52 are electrically connected to the control board 2 through the fixing parts 7 respectively. The stoppers 33 of the middle cover 3 penetrate into the limiting holes 23 of the control board 2 to position the control board 2. As shown in FIG. 3, at this time, three function buttons 21 on the control board 2 project away from the middle cover 3. The upper cover 1 covers the middle cover 3, and the hook parts 11 inside the upper cover 1 is snap fitted to the holding parts 31 of the middle cover 3, thereby clamping the control board 2 between the upper cover 1 and the middle cover 3. In addition, as shown in FIG. 2 and FIG. 3, among the three function buttons 21 on the control board 2, the function button 21 in the middle is opposite to the concave operation part 15b at the middle position of the upper cover 1, and the function buttons 21 at both sides are respectively opposite to the contact posts 12 extending from the bottoms of the convex operation parts 15a, 15c at both sides of the concave operation part 15b of the upper cover 1. That is, as shown in FIG. 2 and FIG. 3, the convex operation part and the concave operation part are provided adjacently and alternatively. An connection part 17 between two adjacent operation parts is provided with a limiting part 18 for limiting the amplitude of the connection part 17 upon pressure. As shown in FIG. 2 and FIG. 3, the limiting part 18 is a limiting post, one end of the limiting post is connected to the inner side of the upper cover 1, and the other end of the limiting post is spaced apart from the control board 2 by a certain distance, so as to preserve descending space for the operation parts upon pressure. Of course, the other end of the limiting post may abut against the control board 2, as the upper cover 1 has certain flexibility, the pressure on the function buttons by the operation parts will not be affected. As shown in FIG. 2, in the present embodiment, the above connection part 17 is an inclined plane positioned between the convex operation part 15a, 15c and the concave operation part 15b. Of course, as shown in FIG. 2 and FIG. 3, the limiting post may be provided on the convex operation parts 15a, 15c at the positions closer to the connection part 17. It should be noted that, when one of the above operation parts is pressed by the user, as the limiting part 18 projects from the bottom of the connection part 17 between operation parts, communication between two adjacent operation parts may be avoided, so that normal operation of each of the function buttons 21 will not be affected by adjacent operation parts. Refer to FIG. 3 and FIG. 4 again, three fixing pieces 41 of the lower cover 4 are respectively aligned with and fixed to three fixing holes 32 of the middle cover 3, so as to fix the lower cover 4 and the middle cover 3 together. The combination between the fixing piece 41 and the fixing hole 32 may be embodied in a detachable manner, such as a detachable riveting manner, or snap-fitting manner, etc., as shown in FIG. 4 and FIG. 7, or in a manner such as gluing or hot riveting, etc.

As can be seen above, since the upper cover 1 and the middle cover 3 are detachably fixed to each other, installation and maintenance are convenient. In addition, since the upper cover 1 employs the structure in which the limiting parts 18 are provided on the connection parts 17 between the operation parts, the problem of interference between the function buttons 21 due to communication therebetween may be avoided. When the combination of the above structures is achieved, a housing is formed by the upper cover 1 and the lower cover 4, and the shielding parts 34 of the middle cover 3 cover the gaps C between the upper cover 1 and the lower cover 4. Since the height of the shielding parts 34 is sufficient to completely cover the gaps C, liquid, moisture or dusts and the like may be prevented from entering the housing through the gaps C.

In the above embodiment, the middle cover 3 may be made of plastic, rubber, flexible glue and the like. The threading parts 35 may have a ring shape, as shown in FIG. 2, or may be formed as arcuate grooves to be penetrated by wires 5. Meanwhile, the above wires 5 may be sleeved in waterproof and dustproof sealing sleeves 6 which may be positioned between the wires 5 and the threading parts 35. The sealing sleeves 6 and the threading parts 35 of the middle cover 3 may be integrally formed from the same material. Upper cover recesses 14 and lower cover recesses 44 may be respectively provided at both ends of the upper cover 1 and the lower cover 4 at the positions opposite to the threading parts 35, so as to allow the wires 5 to pass through. When the sealing sleeves 6 on the wires 5 are clamped by the upper cover 1 and the lower cover 4 by means of the upper cover recesses 14 and the lower cover recesses 44, moisture and dusts are prevented from entering the housing through both ends of the housing.

As can be seen in the above first embodiment of the present invention, the shielding parts 34 of the middle cover 3 may be utilized to prevent moisture and dusts from entering the housing formed by the upper cover 1 and the lower cover 4, the shielding parts 35 and the threading parts 35 are further utilized to prevent moisture and dusts from entering the arrangement space formed by the middle cover 3 and the upper cover 1, and the sealing sleeves 6 are further utilized to seal the housing and the arrangement space.

Figure 5:
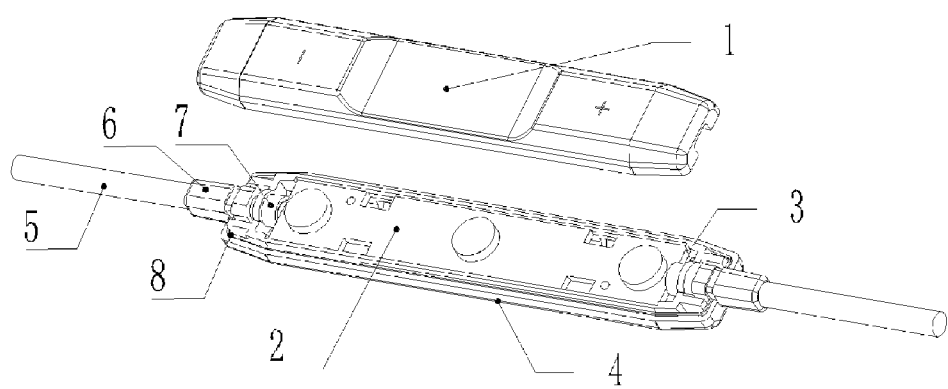
FIG. 5 is a schematic view, in which the upper cover is detached, of the second embodiment of the line control device of an earphone according to the present invention.
Figure 6:
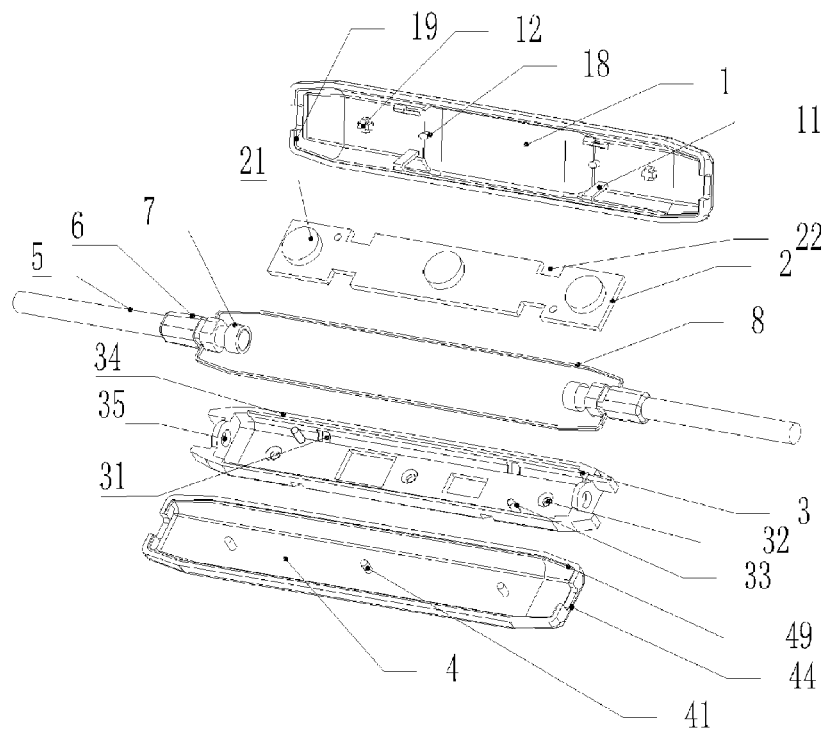
FIG. 6 is an exploded view of the second embodiment of the line control device of an earphone according to the present invention.

Hereinafter, the second embodiment of the present invention will be described in connection with FIG. 5 to FIG. 7.

In the second embodiment, structures and components the same as or similar to those described in the first embodiment will not further described, and only the differences between the second embodiment and the first embodiment are described below. As shown in FIG. 5 and FIG. 6, the second embodiment of the present invention is based on the first embodiment, and strip-shaped sealing strips 8 are provided between the two shielding parts 34 of the middle cover 3 and the gaps C of the housing, and the shielding parts 34 rest against the sealing strips 8, thereby further sealing the gaps C of the housing. More particularly, strip-shaped upper and lower cover grooves 19 and 49 extending along the longitudinal direction are provided inside the opposite edges of the upper cover 1 and lower cover 4 respectively. When the upper cover 1 and the lower cover 4 are relatively close to each other, the opposite upper and lower cover grooves 19 and 49 are combined to form a strip-shaped accommodating groove, and the sealing strips 8 are embedded into the accommodating grooves along the longitudinal direction and seal the gaps between the upper cover 1 and the lower cover 4. The shielding parts 34 of the middle cover 3 abut against the sealing strips 8 towards the gaps C, so as to further seal the gaps C, thereby achieving better moistureproof and dustproof effects. More particularly, it is preferred that, in the direction of pressure applied by the shielding parts 34, the thickness of the sealing strips 8 is slightly larger than the depths of the upper and lower cover grooves 19 and 49, so that the sealing strips 8 are pressed to deform slightly, thereby achieving better moistureproof and dustproof effects. The sealing strips 8 may be made of plastic, rubber or flexible glue.

Moreover, the sealing strips 8 and the shielding parts 34 of the middle cover 3 may be integrally formed from the same material, so that the sealing strips 8 become a part of the shielding parts 34, thereby simplifying assembly operation.

As described above, the line control device of an earphone according to the present invention can achieve smooth multi-function control by using the structure of the limiting part of the connection part between the function buttons; it is convenient to disassemble and replace damaged parts and components and save costs due to the simple elastically snap-fitting manner; besides, by utilizing the shielding parts of the middle cover, perspiration and dust can be prevented from entering inside the line control assembly, so that it is avoided that the function is influenced by the corrosion of the control board.

The invention claimed is:

1. A line control device of an earphone, comprising:
   an upper cover;
   a middle cover, wherein, the middle cover is detachably and fixedly connected to the upper cover, and an arrangement space for arranging a control board is formed between the upper cover and the middle cover;
   a lower cover, wherein, the lower cover is fixedly connected to the middle cover, and a housing which surrounds the control board and the middle cover is formed by the lower cover and the upper cover opposite to each other;
   shielding parts that are formed on edges at both sides of the middle cover, the shielding parts being used for sealing gaps between the upper cover and the lower cover; and
   sealing strips,
   wherein the upper cover has upper cover grooves provided at inner sides of opposite edges of the upper cover and the lower cover has lower cover grooves provided at inner sides of opposite edges of the lower cover, the upper cover grooves and lower cover grooves accommodate the sealing strips, and the shielding parts seal the gaps between the upper cover and the lower cover by abutting against the sealing strips,
   wherein the sealing strips integrally extend from peripheral edges of the shielding parts, and
   wherein a thickness of the sealing strips in the direction of pressure applied by the shielding parts is larger than depths of the upper and lower cover grooves.

2. The line control device of claim 1, wherein, the upper cover and the middle cover are respectively provided with a hook part and a holding part capable of snap fitting with each other.

3. The line control device of claim 2, wherein, the control board is provided with a dodging groove for the hook part to pass through.

4. The line control device of claim 1, wherein, the control board is provided in accommodating grooves at inner edges of the shielding parts of the middle cover, and is limited by a stopper extending from an interior portion of the middle cover to the control board.

5. The line control device of claim 1, wherein, at least two function buttons facing the upper cover are provided on the control board;
   operation parts, which are opposite to the function buttons and are used for pressing and operating the function buttons, are provided on the upper cover, and the operation parts comprise a convex operation part and a concave operation part which are alternately and adjacently provided;
   a limiting part extending from an inner side of the upper cover to the control board is provided on the upper cover, and the limiting part is provided on a connection part between the convex operation part and the concave operation part, or provided on the convex operation part at a position adjacent to the connection part, wherein, the limiting part is used to limit a range for pressing the connection part down.

6. The line control device of claim 5, wherein, the limiting part is a limiting post, one end of the limiting post is connected to the inner side of the upper cover, and another end of the limiting post is spaced apart from the control board, or abuts on the control board.

7. The line control device of claim 1, wherein, threading parts for wires to pass through are provided at both ends of the middle cover, sealing sleeves are sleeved on the wires, and the sealing sleeves are located between the wires and the threading parts.

8. The line control device of claim 7, wherein, the sealing sleeves and the threading parts of the middle cover are integrally formed.

* * * * *